United States Patent [19]
Hong et al.

[11] Patent Number: 5,422,292
[45] Date of Patent: Jun. 6, 1995

[54] PROCESS FOR FABRICATING SPLIT GATE FLASH EEPROM MEMORY

[75] Inventors: Gary Hong, Hsinchu; Hwi-Huang Chen, Taipei; Yau-Kae Sheu, Hsinchu, all of Taiwan, Prov. of China

[73] Assignee: United Microelectronics Corp., Hsinchu, Taiwan, Prov. of China

[21] Appl. No.: 316,504

[22] Filed: Sep. 30, 1994

[51] Int. Cl.⁶ ............................................. H01L 21/8247
[52] U.S. Cl. ........................................ 437/43; 437/44; 437/978
[58] Field of Search ................. 437/42, 43, 44, 978; 148/DIG. 43

[56] References Cited

U.S. PATENT DOCUMENTS

| | | | |
|---|---|---|---|
| 4,795,719 | 1/1989 | Eitan | 437/44 |
| 4,861,730 | 8/1989 | Hsia et al. | 437/43 |
| 5,063,172 | 11/1991 | Manley | 437/44 |
| 5,094,967 | 3/1992 | Shinada et al. | 437/43 |

*Primary Examiner*—Chandra Chaudhari
*Attorney, Agent, or Firm*—Ladas & Parry

[57] ABSTRACT

A new process for fabricating split-gate flash EEPROM memory cell on a semiconductor substrate is described. Source/drain regions are formed apart in the semiconductor substrate to define a channel there between. A tunnel oxide layer, a first conducting layer, and an dielectric layer are successfully formed overlying the semiconductor substrate. The dielectric layer, the first conducting layer, and the tunnel oxide layer are patterned by etching to expose portion of the channel and provide the first conducting layer forming a floating gate. Then, a first oxide layer is formed by thermal oxidation overlying the exposed surfaces of the floating gate and the channel. A second oxide layer is formed by deposition overlying the first oxide layer and the dielectric layer. A control gate layer is formed by depositing and etching a second conducting layer overlying the second oxide layer completing the split-gate flash EEPROM memory cell. The isolation between the floating gate and the control gate can be improved by using the first and second oxide layer, so that preventing the problem of leakage.

6 Claims, 3 Drawing Sheets

PROCESS FOR FABRICATING SPLIT GATE FLASH EEPROM MEMORY

BACKGROUND OF THE INVENTION

1. Field of the Invention

This invention relates in general to electrically erasable and programmable read only memory (EEPROM), and more particularly to a process for fabricating split-gate flash EEPROM memory cell, capable of improving the reliability of the memory cell.

2. Description of the Prior Art

Electrically Erasable and Programmable Read-Only Memory (EEPROM) devices have been widely utilized in a variety of electronic equipment, including microcomputer systems. Conventional EEPROM devices have memory cells which comprise floating-gate transistors. Such devices are able to maintain information written into the memory cells in the absence of a power source for the device, and are further capable of having the information stored in their memory cells erased. These memory devices, however, suffer from their relatively slow read/write access times, which are typically in the range of 150 to 200 nSec. EEPROM devices capable of operating at faster speeds (with 70 to 80 nSec access times) have been developed in the last several years. For example, Intel Corporation of Santa Clara, Calif., has introduced a series of fast EEPROM devices and refers them generically as "Flash Memories."

One of the problems which Flash Memory devices suffer from, is "over-erasure" of the memory cell contents during erasure operations. FIG. 1 depicts the construction of a conventional floating-gate transistor. As can be seen in FIG. 1, the floating-gate transistor comprises a floating gate 10 and a control gate 12. The control gate is capable of injecting electrons from the drain 16, based on a phenomena known as the Fowler-Nordheim Tunnel Effect, through a tunnel oxide layer 14 into the floating gate 10. The threshold voltage of a floating-gate transistor can be raised by means of such electron injection, and the device is then assumes a first memory state that reflects the content of the memory cell. On the other hand, during erasure of the memory cell, electrons are expelled from the source 18 through the tunnel oxide layer 14 and out of the floating gate 10 of the transistor. As a result of this electron removal, the threshold voltage is lowered and thus the device then assumes a second memory state.

During the process of memory content erasure, however, to ensure complete removal of the electrons previously injected, the erasure operation is normally sustained for a slightly prolonged time period. There are occasions when such a prolonged erasure operation results in the removal of excess electrons, i.e., more electrons than were previously injected. This results in the formation of holes in the floating gate of the device. In severe cases, the floating-gate transistor becomes a depletion transistor, which conducts even in the absence of applying a control voltage to the control gate 12. This phenomena is known in the art as memory over-erasure.

To overcome the above described memory over-erasure problem of conventional EEPROM devices, a split-gate EEPROM device was proposed. FIG. 2a schematically shows such a split-gate device. The memory device comprises a floating-gate transistor, which similarly includes a floating gate 20 and a control gate 22, as is in the case of the floating-gate transistor of FIG. 1. However, the floating gate 20 only covers a portion of the channel region and the rest of the channel region is directly controlled by the control gate 22. This split-gate-based memory cell is equivalent to a series connected floating-gate transistor 33 and an enhanced isolation transistor 35, as is schematically represented in FIG. 2b. The principal advantage of such this configuration is obvious: the isolation transistor 35 is free from influence of the state of the floating gate 20 and remains in its off state, even if the floating-gate transistor 33 is subjected to the phenomena of over-erasure and therefore is in a conductive state. The memory cell can thus maintain its correct state, which reflects the correct state of the memory contents, in spite of the over-erasure problem. Since the floating gate 20 of this split-gate memory cell is only formed near the drain region 26, the operation of these devices is different from that of conventional EEPROM devices. During erase the memory cell, electrons previously injected into the floating gate 20 are expelled out via the drain region 26 through the tunnel oxide layer 24.

In the fabrication of split-gate flash EEPROM memory cell as shown in FIG. 2a, the gate oxide layer 40 of the isolation transistor 35 are formed by the same process as forms oxide sidewall spacers 42 for the floating-gate transistor 33 because there two transistors are virtually merged together. A dielectric layer 46 of oxide/nitride/oxide (ONO) configuration is placed on top of the floating gate 20, which is known as an excellent inter-poly dielectric material. However, ONO is not suitable for serving as a gate dielectric 40 for the isolation transistor 35 as the charge trapping effect is very severe when a high voltage is applied between the control gate 22 and the silicon substrate 48. Therefore, conventional split-gate memory cell uses thermal oxide as sidewall spacers 42 adjacent the polysilicon floating gate 20 as well as for the gate oxide layer 40 of the isolation transistor 35.

The drawback of using thermal oxide as sidewall spacers 42 of the floating gate 20 is that the charge stored in the floating gate 20, after programming, easily leaks out. This is regarded as a "DC-erasure" problem. The reason for occurrence of the "DC-erasure" problem can be explained as follows. The figure previously discussed are idealized representations of the split gate structure. Since polysilicon has many grain boundaries, asperities can and do occur. FIG. 3 shows a possible real shape of the polysilicon floating gate 20 and the oxide sidewall spacers 42 of a conventional split-gate flash EEPROM memory cell. Due to the asperities, the oxidation rate at the surface of polysilicon floating gate 20 is not uniform. The resulting non-uniform thermal oxide sidewall spacers 42 plus the polysilicon asperities can result in charge leakage from floating gate 20 to control gate 22 when a positive voltage is applied at control gate 22. This results in loss of contents stored in the memory cells.

SUMMARY OF THE INVENTION

It is therefore an object of the present invention to provide a process for fabricating split-gate flash EEPROM devices capable of preventing the problem of over-erasure as well as the problem of DC-erasure.

In accordance with the object of the present invention, a new process for fabricating split-gate flash EEPROM memory cell on a semiconductor substrate is described. Source/drain regions are formed apart in the semiconductor substrate to define a channel there between. A tunnel oxide layer, a first conducting layer, and an dielectric layer are successfully formed overlying the semiconductor substrate. The dielectric layer, the first conducting layer, and the tunnel oxide layer are patterned by etching to expose portion of the channel and provide the first conducting layer forming a floating gate. Then, a first oxide layer is formed by thermal oxidation overlying the exposed surfaces of the floating gate and the channel. A second oxide layer is formed by deposition overlying the first oxide layer and the dielectric layer. A control gate layer is formed by depositing and etching a second conducting layer overlying the second oxide layer completing the split-gate flash. EEPROM memory cell. The isolation between the floating gate and the control gate can be improved by using the first and second oxide layer, so that preventing the problem of leakage.

BRIEF DESCRIPTION OF THE DRAWINGS

Other objects, features and advantages of the present invention will become apparent by way of the following detailed description of the preferred but non-limiting embodiment, with reference to the accompanied drawings, wherein:

FIG. 2b is a schematic diagram showing the electrical equivalent of the memory cell of FIG. 2a;

FIG. 3 is a diagram showing a possible real shape of the memory cell of FIG. 2a;

DETAILED DESCRIPTION OF THE PREFERRED EMBODIMENT

Figure 4A:
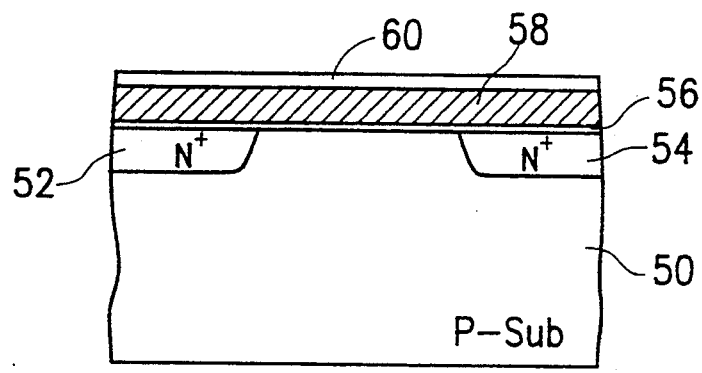
FIGS. 4a to 4d illustrate in cross sectional views the process steps of a preferred embodiment for fabricating a split-gate flash EEPROM memory cell according to the present invention.

Referring to FIG. 4a, there is shown a semiconductor substrate, such as a P-type silicon substrate 50. A photoresist layer (not shown) is coated and exposed to define a pattern on the surface of the silicon substrate 50. N type impurities, such as arsenic ions, are implanted into portions of the silicon substrate 50 not covered by the photoresist to form a source region 52 and a drain region 54. Thus a channel region is defined between the source region 52 and the drain region 54. After removing the photoresist, a tunnel oxide layer 56, for example, with a thickness of about 100Å, is formed overlying the silicon substrate 50 by thermal oxidation or chemical vapor deposition (CVD). A first conducting layer 58, such as a doped polysilicon layer with a thickness of about 2000Å, is formed overlying the tunnel oxide layer 56, preferably by CVD. A dielectric layer 60, such as an ONO layer, is formed overlying the first conducting layer 58. In this embodiment, a bottom oxide layer with a thickness of between 50Å to 80Å is first deposited on the first conducting layer 58. A nitride layer with a thickness of about 180Å is next deposited on the bottom oxide layer. Then, a thermal oxide layer with a thickness of about 30Å is formed on the nitride layer. The three layers are collectively referred to as an ONO layer or configuration.

Figure 4B:
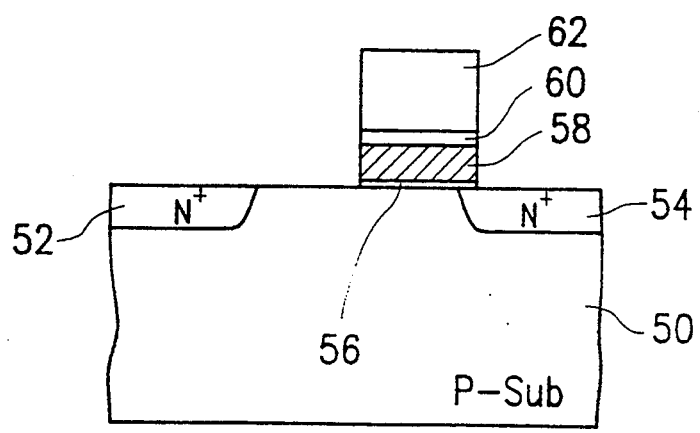

Referring to FIG. 4b, a photoresist layer 62 is coated and exposed by conventional lithography process to define a pattern on the surface of the dielectric layer 60. Portions of the dielectric layer 60, the first conducting layer 58, and the tunnel oxide layer 56 not covered by the photoresist 62 are removed, preferably by reactive ion etching (RIE), to expose a portion of the channel region. The patterned first conducting layer 58 serves as a floating gate 58. The photoresist layer 62 is next removed using a suitable solvent.

Figure 4C:
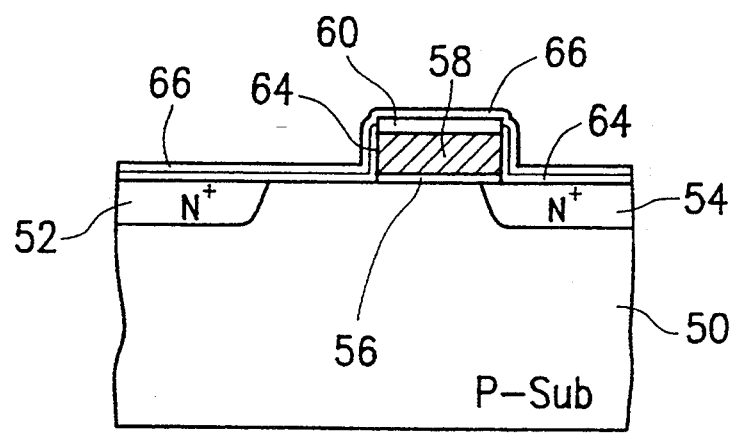
Figure 4D:
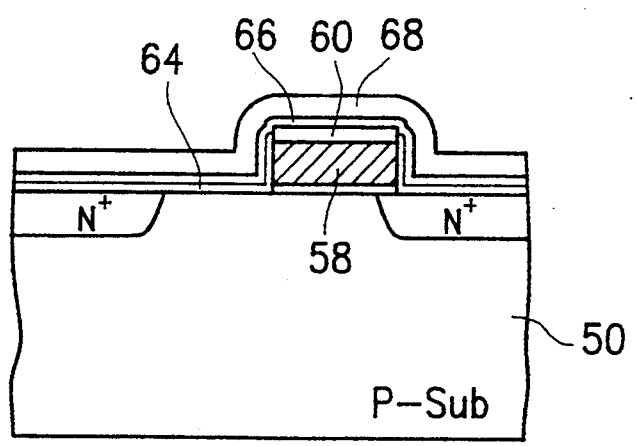

Turning now to FIG. 4c, a first oxide layer 64, with a thickness preferably between 100Å to 200Å, is formed on the exposed surfaces of the floating gate 58 and silicon substrate 50 (the channel region) by thermal oxidation. A second oxide layer 66 with a thickness of between 100Å to 200Å is formed on the surfaces of the first oxide layer 64 and the dielectric layer 60 by CVD. A second conducting layer 68, such as a polysilicon layer, is deposited and implanted with impurities overlying the second oxide layer 66. The second conducting layer 68 is then patterned, preferably by conventional photolithographic techniques and RIE, to define a control gate 68, as shown in FIG. 4d, thereby completing the split-gate flash EEPROM memory cell. Additional process steps will be perform to complete the fabrication of a final EEPROM device, which include such steps as the formation of a flattened BPSG protective layer, the formation of metal interconnections, and the formation of a top passivation layer.

Figure 1:
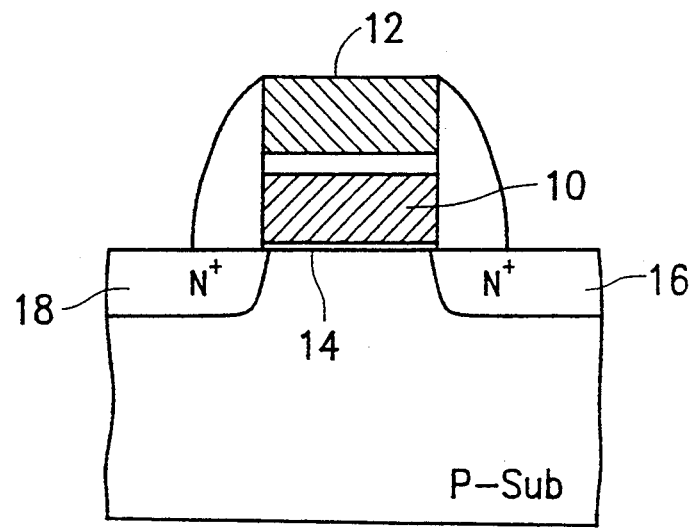
FIG. 1 illustrates in cross sectional view the structure of a prior art floating-gate transistor for a EEPROM memory cell.
Figure 2A:
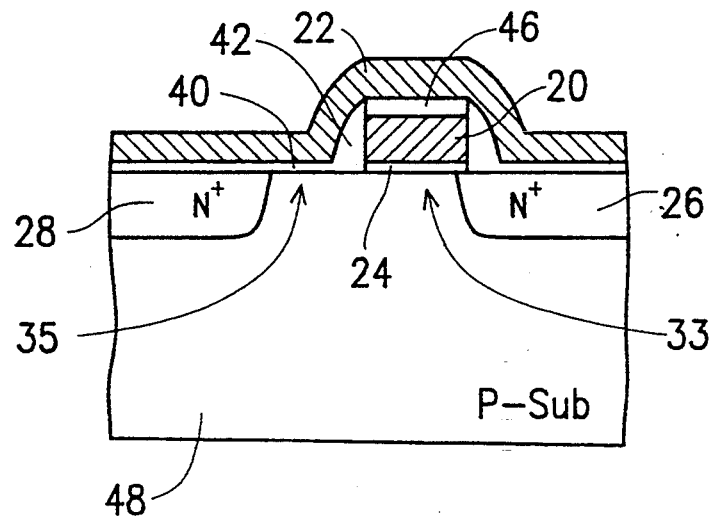
FIG. 2a illustrates in cross sectional view the structure of a prior art split-gate EEPROM memory cell.
Figure 2B:
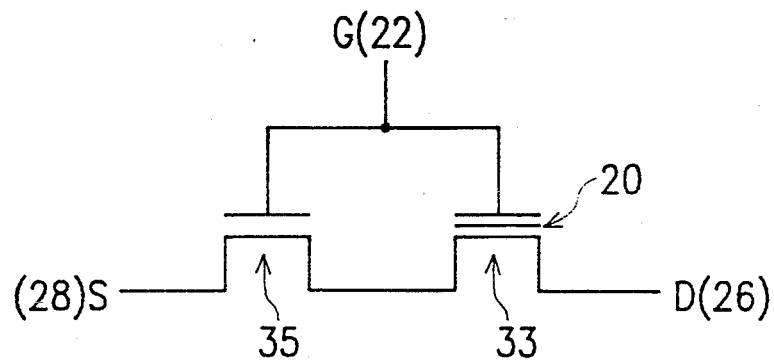
Figure 3:
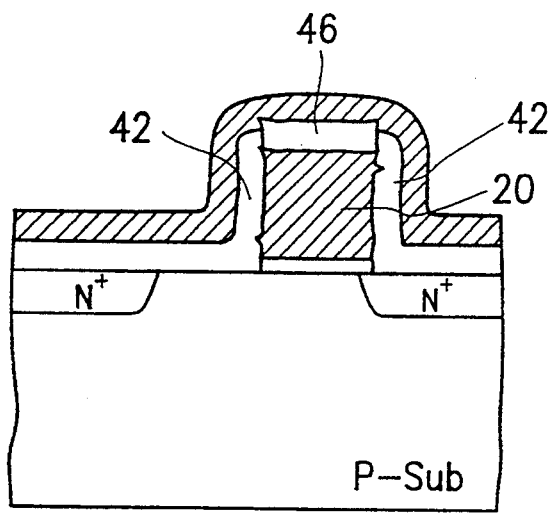
Figure 5:
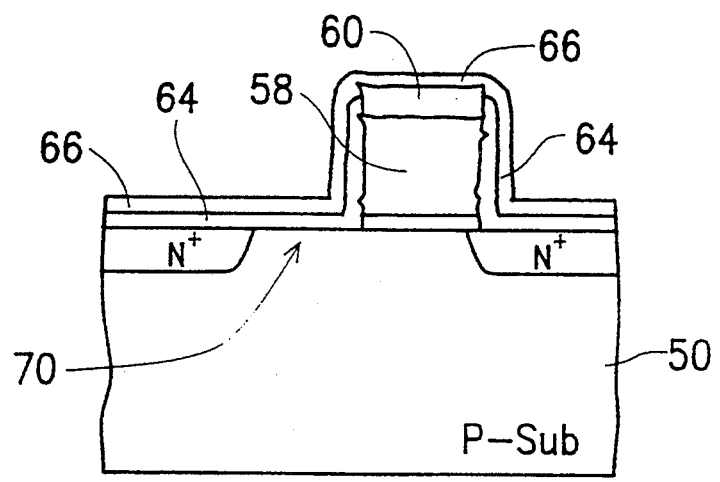
FIG. 5 is a diagram showing a possible real shape of the split-gate flash EEPROM memory cell of FIG. 4c.

The purpose of forming a CVD oxide layer 66 overlying the thermal oxide layer 64 is to improve the isolation property of the silicon dioxide between the sidewalls of the floating gate 58 and the control gate 68, so as to solve the above described "DC-erasure" problem. In order to understand the advantages of this invention, a more detailed description is provided with reference to FIG. 5 which shows a possible real shape of the split-gate flash EEPROM memory cell of FIG. 4c. First, since there is an ONO dielectric layer 60, which is a well known good insulating material, formed on top of the floating gate 58, leakage will not happen there between. Second, a thermal oxide layer 64 and a CVD oxide layer 66 are formed together on the sidewalls of the floating gate 58 to serve as an inter-poly dielectric layer between the floating gate 58 and the control gate 68. All of the polysilicon asperities are covered by such inter-poly dielectric layer. Thus the "DC-erasure" problem of the memory cell can be prevented resulting in a better reliability. Besides, portions of the thermal oxide layer 64 and the CVD oxide layer 66 over the channel region of the isolation transistor 70 are able to serve as a desirable gate oxide layer. Hence transistor 70 of FIG. 5 can provide the same sort of isolation as does transistor 35 in FIG. 2a.

Persons skilled in this art can appreciate the fact that the exemplified embodiment as employed in the above descriptive paragraphs has utilized a component of a $N^-$-type channel, which, obviously can be replaced with a $P^-$-type as well. In addition, all the described materials, conductance types, dimensions and process conditions are for the purpose of description, and not to limit the scope of the present invention, except as required by the claims. Modification will now suggest itself to those skilled in the art and therefore the presently disclosed invention should not be limited to the disclosed embodiments.

What is claimed is:

1. A process for fabricating a split-gate flash EEPROM memory cell on a semiconductor substrate, comprising the steps of:

introducing an impurity into said semiconductor substrate to form source/drain regions which are spaced apart to define a channel there between;

forming a tunnel oxide layer overlying said semiconductor substrate;

forming a first conducting layer overlying said tunnel oxide layer;

forming a dielectric layer overlying said first conducting layer;

patterning said dielectric layer, said first conducting layer, and said tunnel oxide layer to expose a portion of said channel, said patterned first conducting layer forming a floating gate;

forming a first oxide layer by thermal oxidation overlying the exposed surfaces of said floating gate and said channel;

forming a second oxide layer by deposition overlying said first oxide layer and said dielectric layer; and forming a second conducting layer overlying said second oxide layer, and patterning said second conducting layer to form a control gate completing said split-gate flash EEPROM memory cell.

2. The process of claim 1 wherein the step of forming said dielectric layer is done by forming an oxide/nitride/oxide layer.

3. The process of claim 2 wherein said oxide/nitride/oxide layer is formed by the steps of:

forming a bottom oxide layer with a thickness of between 50Å to 80Å on said first conducting layer;

forming a nitride layer with a thickness of about 180Å on said bottom oxide layer; and forming a top oxide layer with a thickness of about 30Å on said nitride layer.

4. The process of claim 1 wherein the steps of forming said first conducting layer and said second conducting layer are both done by depositing a polysilicon layer and implanting impurities into said polysilicon layer.

5. The process of claim 1 wherein said first oxide layer has a thickness of between 100Å to 200Å.

6. The process of claim 1 wherein said second oxide layer has a thickness of between 100Å to 200Å.

* * * * *